(12) United States Patent
Kariya et al.

(10) Patent No.: US 8,409,461 B2
(45) Date of Patent: Apr. 2, 2013

(54) METHOD OF MANUFACTURING PRINTED WIRING BOARD WITH COMPONENT MOUNTING PIN

(75) Inventors: Takashi Kariya, Ogaki (JP); Toshiki Furutani, Ogaki (JP); Takeshi Kawanishi, Ogaki (JP)

(73) Assignee: Ibiden Co., Ltd., Ogaki (JP)

( * ) Notice: Subject to any disclaimer, the term of this patent is extended or adjusted under 35 U.S.C. 154(b) by 1082 days.

(21) Appl. No.: 11/566,847

(22) Filed: Dec. 5, 2006

(65) Prior Publication Data

US 2007/0256297 A1    Nov. 8, 2007

(30) Foreign Application Priority Data

Dec. 9, 2005   (JP) ................. 2005-356119

(51) Int. Cl.
  *C03C 15/00*   (2006.01)
  *C03C 25/68*   (2006.01)
  *H05K 3/00*    (2006.01)
(52) U.S. Cl. .............. 216/83; 29/829; 29/846; 29/847
(58) Field of Classification Search ............. 427/96.1; 29/829, 846, 847; 438/52; 361/306.3; 216/83
  See application file for complete search history.

(56) References Cited

U.S. PATENT DOCUMENTS

| | | | |
|---|---|---|---|
| 4,828,346 A * | 5/1989 | Jacobsen et al. ........... | 359/360 |
| 5,280,139 A | 1/1994 | Suppelsa et al. | |
| 5,491,301 A | 2/1996 | Akiba et al. | |
| 5,495,667 A | 3/1996 | Farnworth et al. | |
| 5,613,861 A | 3/1997 | Smith et al. | |
| 5,635,750 A | 6/1997 | Schlaak et al. ............ | 257/414 |

(Continued)

FOREIGN PATENT DOCUMENTS

| EP | 1 277 696 A2 | 1/2003 |
|---|---|---|
| JP | 2-218143 | 8/1990 |

(Continued)

OTHER PUBLICATIONS

U.S. Appl. No. 11/566,862, filed Dec. 5, 2006, Kariya, et al.

(Continued)

*Primary Examiner* — Duy Deo
*Assistant Examiner* — Mahmoud Dahimene
(74) *Attorney, Agent, or Firm* — Oblon, Spivak, McClelland, Maier & Neustadt, L.L.P.

(57) ABSTRACT

The present invention is to provide a method of manufacturing a printed wiring board with a component mounting pin to connect a printed wiring board and an electronic component. A method of manufacturing a printed wiring board (1) with a component mounting pin (18) at a stage to form a component mounting surface after layers of a predetermined number were formed includes the steps of forming a conductive land (11) on the component mounting surface, covering the component mounting surface with an insulating layer (12) except the conductive land (11) of the component mounting surface, partly forming near the conductive land (11) of the upper surface of the insulating layer (12) a sacrificial layer (14) which can be removed in the subsequent process, forming conductive layers (16, 17) on the upper surfaces of the conductive land (11) and the sacrificial layer (14) with a plating process to pattern the conductive layers (16, 17), forming the component mounting pin (18) elongated from the conductive land (11) by partly removing the sacrificial layer (14) located under the patterned conductive layers (16, 17) and erecting the component mounting pin (18).

12 Claims, 8 Drawing Sheets

U.S. PATENT DOCUMENTS

| | | | |
|---|---|---|---|
| 5,719,448 A | 2/1998 | Ichikawa | |
| 6,049,976 A | 4/2000 | Khandros | |
| 6,229,683 B1 | 5/2001 | Goodwin-Johansson | 361/233 |
| 6,287,126 B1 | 9/2001 | Berger et al. | |
| 6,290,510 B1 | 9/2001 | Fork et al. | |
| 6,324,067 B1 | 11/2001 | Nishiyama | |
| 6,778,406 B2 | 8/2004 | Eldridge et al. | |
| 6,935,867 B1 | 8/2005 | Takai et al. | |
| 7,160,121 B2 | 1/2007 | Van Schuylenbergh et al. | |
| 7,230,440 B2 | 6/2007 | Hantschel et al. | |
| 7,497,694 B2 | 3/2009 | Kariya et al. | |
| 7,530,814 B2 | 5/2009 | Ramaswamy et al. | |
| 7,553,165 B2 | 6/2009 | Mathieu et al. | |
| 7,731,504 B2 | 6/2010 | Kariya et al. | |
| 7,773,388 B2 | 8/2010 | Kariya et al. | |
| 7,891,089 B2 | 2/2011 | Kariya et al. | |
| 2002/0164893 A1 | 11/2002 | Mathieu et al. | |
| 2002/0192364 A1* | 12/2002 | Kanoh et al. | 427/123 |
| 2003/0030965 A1* | 2/2003 | Chua et al. | 361/306.3 |
| 2003/0121698 A1 | 7/2003 | Kyougoku et al. | |
| 2003/0132027 A1 | 7/2003 | Maruyama et al. | |
| 2005/0155706 A1 | 7/2005 | Nishida et al. | |
| 2006/0040417 A1 | 2/2006 | Eldridge et al. | |
| 2006/0088705 A1* | 4/2006 | Mitsumori | 428/209 |
| 2006/0139145 A1 | 6/2006 | Ono | |
| 2006/0220234 A1 | 10/2006 | Honer et al. | |
| 2009/0053910 A1 | 2/2009 | Kariya et al. | |

FOREIGN PATENT DOCUMENTS

| | | |
|---|---|---|
| JP | 7-7263 | 1/1995 |
| JP | 7-326619 | 12/1995 |
| JP | 11-506829 | 6/1999 |
| JP | 2000-512437 | 9/2000 |
| JP | 2000-357762 | 12/2000 |
| JP | 2001-502851 | 2/2001 |
| JP | 2002-76618 | 3/2002 |
| JP | 2003-86739 | 3/2003 |
| JP | 2003-198068 | 7/2003 |
| JP | 2004-40138 | 2/2004 |
| JP | 2004-198352 | 7/2004 |
| JP | 2004-311919 | 11/2004 |
| JP | 2005-183466 | 7/2005 |
| JP | 2005-340177 | 12/2005 |
| KR | 1999-022385 | 3/1999 |
| KR | 2001-0012575 | 2/2001 |
| WO | WO 96/15458 | 5/1996 |
| WO | WO 96/41506 | 12/1996 |
| WO | WO 98/50953 | 11/1998 |
| WO | WO 98/52224 | 11/1998 |
| WO | WO9918445 * | 4/1999 |
| WO | WO 01/97235 A1 | 12/2001 |
| WO | WO 2007/066563 A1 | 6/2007 |
| WO | WO 2007/066564 A1 | 6/2007 |

OTHER PUBLICATIONS

U.S. Appl. No. 11/566,912, filed Dec. 5, 2006, Kariya, et al.

Kiyoshi Takagi, "Chapter 6 Process for Build-Up Multilayer Printed Wiring Board", Build-Up Multilayer Printed Wiring Board Technologies, Jun. 20, 2000, 15 pages (with extracted English translation).

Hongjian Wang, "Electroplating Technology", Harbin Institute of Technology Press, $2^{nd}$ Edition $2^{nd}$ Impression: Oct. 1995 (with Partial English Translation), 11 pages.

* cited by examiner

US 8,409,461 B2

METHOD OF MANUFACTURING PRINTED WIRING BOARD WITH COMPONENT MOUNTING PIN

BACKGROUND OF THE INVENTION

1. Field of the Invention

The present invention relates to a method of manufacturing a printed wiring board with a component mounting pin, and more particularly to a method of manufacturing a printed wiring board with a component mounting pin to connect a printed wiring board and an electronic component.

2. Description of the Related Art

A number of electronic components (e.g. semiconductor apparatus such IC and LSI) are employed to fabricate electronic apparatus. A printed wiring board is used to electrically connect electrode pads of these semiconductor apparatus. Since it is inevitable that highly-integrated semiconductor apparatus includes a large number of electrodes, in order to mount such semiconductor apparatus on a printed wiring board with a limited area, it is customary that a flip-chip mounting system is used to mount the electrode pads of the semiconductor chip on the printed wiring board in such a manner that their surfaces are opposed to the printed wiring board to thereby connect the electrode pads to the lands of the printed wiring board mounting surface by a suitable technology such as solder bump.

In the document of the present application, "printed wiring board" refers to a board with a wiring pattern formed on an insulating substrate, and "printed circuit board" refers to a component product in which electronic components such as IC and LSI are mounted on the printed wiring board. The printed circuit board is a component product of an electronic component with predetermined objects and therefore referred to as an "electronic device".

[Patent Document 1]: Japanese Patent Laid-open Publication No. 2005-183466 "MULTILAYER PRINTED WIRING BOARD" (published on Jul. 7, 2005).

The Background Art of the Patent Document 1 has described a flipchip mounting system printed circuit board using suitable technology such as solder bump in which a solder resist layer 70 is formed on an upper layer of a via hole 160 and a conductor circuit 158, bumps 76U and 76D being formed on the via hole 160 and the conductor circuit 158 through an opening portion 71 of the solder resist layer 70. An IC chip, not shown may be electrically connected to the printed circuit board by C4 (flip-chip) mounting.

However, the above Patent Document 1 fails to mention a printed wiring board with a component mounting pin and also fails to mention a method of manufacturing such printed wiring board disclosed in the present application.

SUMMARY OF THE INVENTION

On the other hand, as integration degree of semiconductor apparatus is increasing more in recent years, a chip size thereof also is becoming enormous. If an electronic device in the mounting state in which an electrode pad of an electronic component (e.g. semiconductor chip) of a gigantic size and a land of a printed wiring board are soldered is exposed to rise and fall of an ambient temperature, then there is the possibility that a soldered portion will be broken due to a difference between coefficients of thermal expansion of the electronic component and the printed wiring board.

In Japanese Patent Application Number 2005-356049 entitled "PRINTED WIRING BOARD WITH COMPONENT MOUNTING PIN AND ELECTRONIC DEVICE USING THE SAME" filed on the same day of the present application, the inventors of the present application has proposed a technology in which a printed wiring board and an electronic component are connected by a resilient component mounting pin. According to this previously-proposed technology, even when an electronic component such as a highly-integrated semiconductor apparatus is mounted on a printed wiring board, an expansion difference caused by a difference between coefficients of thermal expansion of a semiconductor chip and a printed wiring board can be absorbed by the resilient component mounting pin to thereby decrease disconnection or malconnection.

Therefore, a development of a method of manufacturing a printed wiring board with a component mounting pin has been demanded.

Accordingly, the present invention is to provide a method of manufacturing a printed wiring board with a component mounting pin to connect a printed wiring board and an electronic component.

In the light of the above aspect, a printed wiring board manufacturing method of the present invention at a stage to form a component mounting surface after layers of a predetermined number are formed, comprising the steps of: forming a conductive land on said component mounting surface; exposing at least part of said conductive land by covering said component mounting surface with an insulating layer; partly forming on the upper surface of said insulating layer a sacrificial layer which can be removed in the subsequent process; forming conductive layers on the upper surfaces of said conductive land and said sacrificial layer with a plating process to pattern said conductive layers; forming a component mounting pin elongated from said conductive land by removing either part of or whole of said sacrificial layer located under said patterned conductive layers; and erecting said component mounting pin.

Further, in the printed wiring board manufacturing method, said component mounting pin may be formed of n layers ($n \geq 2$) and a film of a first layer may be easy to expand relative to a film of an nth layer where a film located on the side opposing to said printed wiring board is expressed as n=1.

Further, in the printed wiring board manufacturing method, stress of an n-1th layer may be tensile stress relative to stress of said nth layer or it may be equal to the stress of said nth layer, and stress of said first layer may be under tensile stress relative to the stress of said nth layer.

Further, in the printed wiring board manufacturing method, said n-1th layer may be equal to or higher than in coefficient of thermal expansion said nth layer, and said first layer may have a higher coefficient of thermal expansion than that of thermal expansion of said nth layer.

Further, in the printed wiring board manufacturing method, said first plating layer may be formed by electroless copper plating and an electroless plating bath may contain at least one kind of metal ion as an additive to suppress hydrogen from being generated.

Further, in the printed wiring board manufacturing method, said metal ion may be at least one kind of metal ion selected from a group consisting of nickel ion, iron ion and cobalt ion.

Further, in the printed wrg board manufacturing method, said second plating layer may be formed by electroless copper plating and an electroless plating bath may contain at least EDTA as tartaric acid to cause said second plating layer to contain a large quantity of hydrogen.

Further, in the printed wiring board manufacturing method, said insulating layer may be a solder resist layer.

Further, in the printed wiring board manufacturing method, said sacrificial layer may be formed of a Sn layer deposited by sputtering.

Further, in the printed wiring board manufacturing method, said process for partly removing said sacrificial layer may be carried out by adjusting an etching time.

Further, a printed wiring board manufacturing method of the present invention at a stage to form a component mounting surface after layers of a predetermined number are formed, comprising the steps of: forming a conductive land on said component mounting surface; exposing at least part of said conductive land by covering said component mounting surface with an insulating layer; partly forming on the upper surface of said insulating layer a sacrificial layer which can be removed in the subsequent process; forming conductive layers on the upper surfaces of said conductive land and said sacrificial layer with a plating process to pattern said conductive layers; forming a component mounting pin elongated from said conductive land by removing either part of or whole of said sacrificial layer located under said patterned conductive layers; and erecting said component mounting pin by annealing.

Further, in the printed wiring board manufacturing method, said conductive layer may be formed of a Mo/Cr film.

Further, in the printed wiring board manufacturing method, said conductive layer may be formed of more than two kinds of metals with different coefficients of thermal expansion and it may be formed by a combination of an upper metal with a relatively low coefficient of thermal expansion and a lower metal with a relatively high coefficient of thermal expansion.

Further, in the printed wiling board manufacturing method, said insulating layer may be a solder resist layer.

Further, in the printed wiring board manufacturing method, said sacrificial layer may be formed of a Ti layer deposited by sputtering.

Further, in the printed wiring board manufacturing method, said process for partly removing said sacrificial layer may be carried out by adjusting an etching time.

Further, in the printed wiring board manufacturing method, it may further comprise a step of forming on the whole surface of the upper surface of said insulating layer a sacrificial layer which can be removed in the subsequent process.

According to the present invention, it is possible to provide a method of manufacturing a printed wiring board with a component mounting pin to connect a printed wiring board and an electronic component.

EXPLANATION OF REFERENCE NUMERAL

Figure 1:
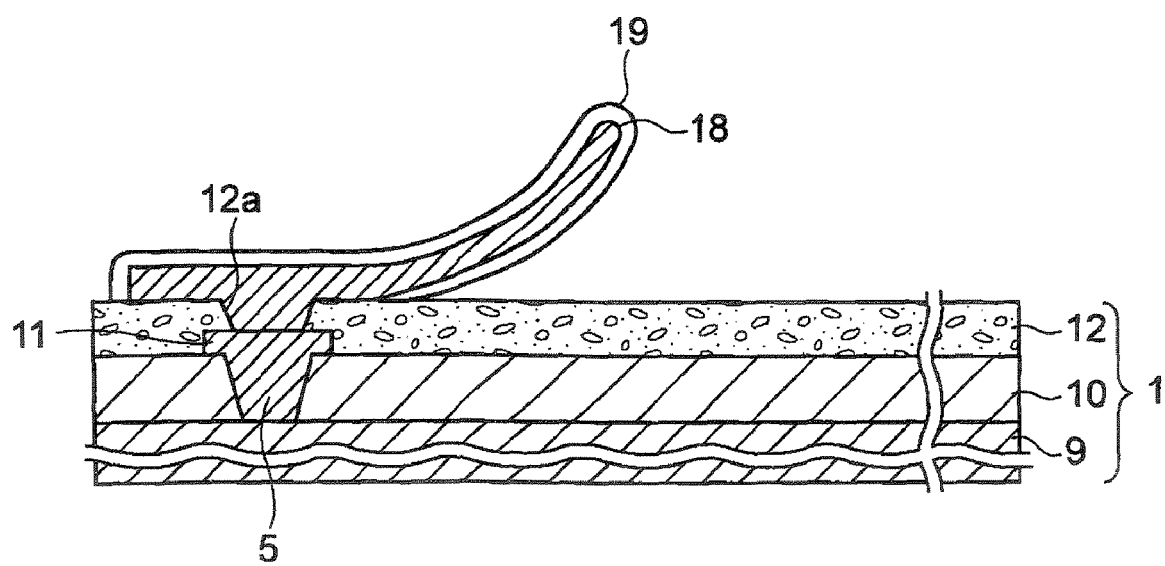
FIG. 1 is a diagram showing part of an arrangement of a printed wiring board with a component mounting pin.

1:printed wiring board, 2:semiconductor apparatus (IC, LSI, etc.), 3:electrode pad, 4,5:electronic device, 7:solder bump, 8:filled via, 10:insulating layer, 11:outermost layer conductor, conductive land, 12:solder resist layer, 12a:opening, 13:dry film, 13a:opening, 14:Sn layer, 15:catalytic nucleus for electroless plating, 16:first plating layer, 17:second plating layer, 18:component mounting pin, 19:protective film, coating, 20:Mo/Cr film, 21:etching resist, 25:dry film, etching resist, 27:Ti layer

DESCRIPTION OF THE PREFERRED EMBODIMENTS

Embodiments of a method of manufacturing a printed wiring board with a component mounting pin according to the present invention will be described below in detail with reference to the accompanying drawings, wherein identical elements and parts are denoted by identical reference numerals and therefore need not be described.

[Printed Wiring Board with Component Mounting Pin]

First, in order to facilitate the understanding of the present invention, an arrangement of a printed wiring board with a component mounting pin manufactured by a manufacturing method according to the embodiment of the present invention will be described in brief.

FIG. 1 of the accompanying drawings is a diagram showing part of a printed wiring board with a component mounting pin. A printed wiring board 1 according to the embodiment of the present invention includes a component mounting pin 18 to connect with an electronic component (not shown) like a semiconductor apparatus such as an IC and an LSI. The printed wiring board 1 with a component mounting pin according to the embodiment of the present invention is characterized by the component mounting pin 18 electrically connected to an outermost conductor 11. Accordingly, a rest of the arrangement of the printed wiring board 1 can be changed freely. The printed wiring board 1 will be described such that an insulating layer 10 with the outermost layer conductor 11 formed thereon, a solder resist layer 12 formed on the insulating layer 10 and other layer 9 formed under the insulating layer 10, each of which comprises the printed wiring board 1, will be highlighted separately in order to explain the present embodiment more clearly.

For example, the printed wiring board 1 includes the solder resist layer 12 with an opening 12a and the substrates 9 and 10. The substrate 10 is the insulating layer formed under the solder resist layer 12 and the substrate 9 is composed of a predetermined conductive layer and an insulating layer. The insulating layer 10 has a filled via hole 5 and the upper portion of the filled via hole 5 is formed as the outermost conductor 11.

The component mounting pin 18 is made of a material having suitable properties such as flexibility, elasticity and pliability and should preferably be made of a material with low electric resistance in addition to flexibility, elasticity and pliability. One end of the component mounting pin 18 is electrically connected to the outermost conductor 11 and the other end thereof is erected upward from the printed wiring board 1. The component mounting pin 18 might be covered with a desired conductive protective coating 19 if necessary. The printed wiring board 1 is connected to an electronic component (not shown) by this component mounting pin 18.

Figure 2:
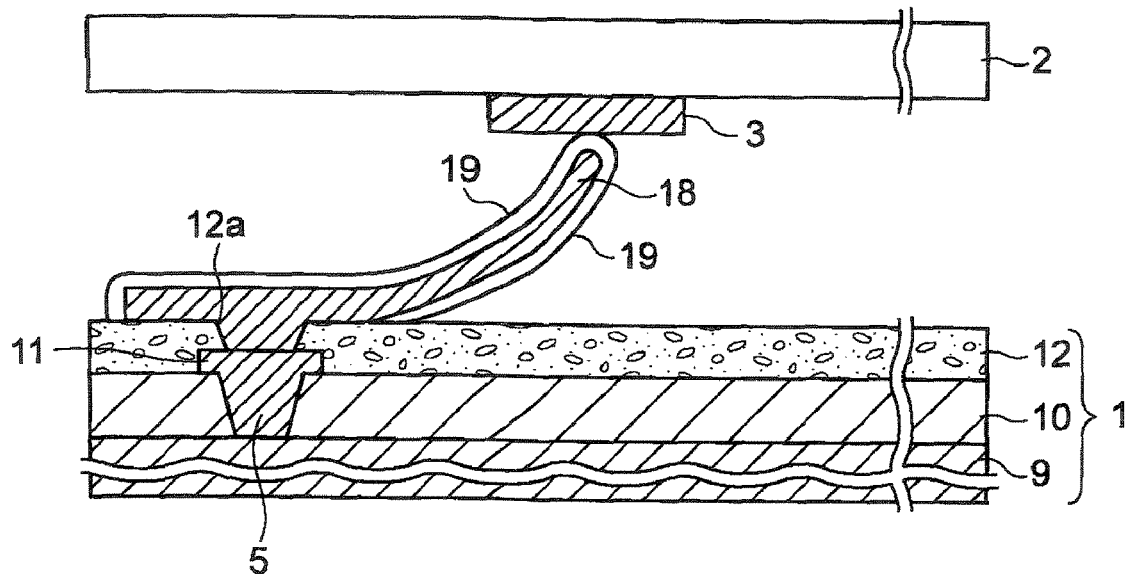
FIG. 2 is a diagram showing part of an electronic device using a printed wiring board with a component mounting pin.

FIG. 2 is a diagram showing part of the electronic device 4 using the printed wiring board 1 with the component mounting pin 18, revealing the mounting structure. As shown in FIG. 2, the component mounting pin 18 of the printed wiring board 1 mechanically contacts with the electrode pad 3 formed on the electronic component 2 like the semiconductor apparatus such as IC and LSI to maintain electric connection between it and the electronic component 2.

The component mounting pin 18 is a machine element that can absorb force (mechanical energy) applied to either of or both of the semiconductor apparatus 2 and the printed wiring board 1 by either elasticity or deformation. As a result, it is possible to decrease disconnection or malconnection caused by a difference between coefficients of thermal expansion of the semiconductor apparatus 2 and the printed wiring board 1.

As a typical method of manufacturing the printed wiring board with the component, there are a manufacturing method using plating (plating method) and a manufacturing method using sputtering (sputtering method).

Figure 3:
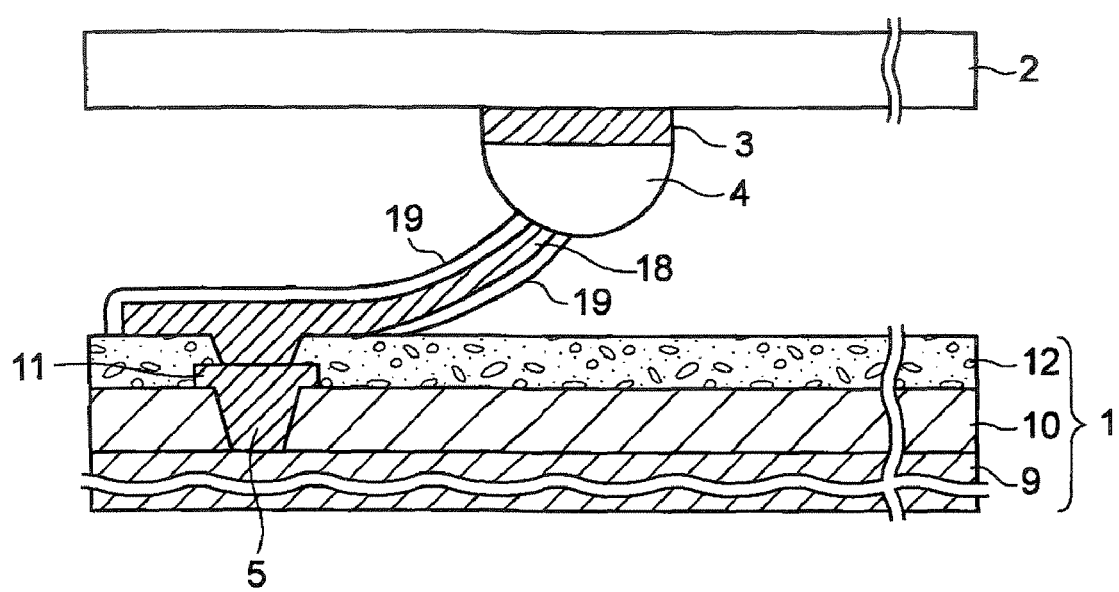
FIG. 3 is a diagram showing part of an electronic device in which electric connection can be maintained between a component mounting pin of a printed wiring board and an electronic component by soldering.

FIG. 3 is a diagram showing part of the electronic device 5 in which electric connection is maintained between the component mounting pin 18 of the printed wiring board 1 and the electronic component 2 by soldering and reveals the mounting structure. If requested, the component mounting pin 18 of the printed wiring board 1 may include the solder bump 4 formed at its tip end potion and the component mounting pin 18 and the electrode pad 3 of the semiconductor apparatus 2 are connected by soldering through solder reflow in a state of having the electrode pad 3 mechanically brought in contact with the semiconductor apparatus 2 as shown in FIG. 2.

[Manufacturing Method Using Plating]

A typical example of a method of manufacturing a printed wiring board with a component mounting pin will be described with reference to FIGS. 4A to 4M in conjunction with a method using plating (plating method).

Since this manufacturing method is characterized by a component mounting pin using an outermost conductor 11, other portions (see reference numerals 9 and 10 in FIGS. 1 to 3) than the outermost conductor 11 were already formed by a well-known build-up method as follows.

For example, a double-sided copper clad laminate having a thickness in between 0.06 and 0.6 mm (e.g. manufactured by HITACHI CHEMICAL CO., LTD. under trade name of MCL-E-76, etc.) is used as a King material. Through-holes are formed on this laminate by using a drill or laser, a through-hole conductor is formed by plating and conductor circuits are formed on both surfaces of the substrate, thereby resulting in a core substrate being produced. While interlayer insulators and conductor circuit layers of a predetermined number of layers are alternately laminated on this core substrate by the build-up manufacturing method, predetermined conductor circuit layers are connected by a predetermined via hole 8 (see FIGS. 1 to 3) and a semiconductor connection land 11 is formed on the outer layer.

With respect to such printed wiring board manufacturing method, refer to Japanese Patent Laid-open Publication No. 200440138 "BUILD-UP MULTILAYER PRINTED WIRING BOARD" (published on Feb. 5, 2004) and Japanese Patent Laid-open Publication No. 2004-311919 "THROUGH-HOLE FILL METHOD" (published on Nov. 4, 2004). With respect to the build-up manufacturing method, refer to "BUILD-UP MULTILAYER PRINTED WIRING BOARD TECHNOLOGY" written by Kiyoshi Takagi, published by THE NIKKANKOGYO SHINBUN, LTD., on Jun. 20, 2000.

From the foregoing, it is to be appreciated that other elements and parts than the outermost conductor 11 are omitted from the description of the following manufacturing method.

Figure 4A:
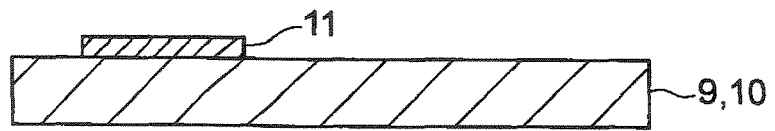
FIGS. 4A to 4L are diagrams showing respective processes of a method of manufacturing a printed wiring board with a component mounting pin by plating.

FIG. 4A is a diagram showing a process for preparing a substrate. Although not shown, the substrates 9 and 10 are composed of printed wiring boards in which portions other than the outermost conductor 11 are formed. The outermost conductor 11 is formed by a full-additive method, a semi-additive method or by a subtractive method.

With respect to a method of forming the conductive land 11, refer to Japanese Patent Laid-open Publication No. 2000-357762 "PACKAGE SUBSTR-ATE" (published on Dec. 26, 2000). Also, size, pitch, placement and number of the conductive land 11 can be varied by changing a plating resist pattern of the foregoing Japanese Patent Laid-open Publication No. 2000-357762.

An electronic component connection land having a thickness of 20 μm, a diameter (diameter of conductive land) of 150 μm and a minimum pitch (distance between the adjacent conductive lands) of 200 μm is formed as this outermost conductor 11. Placement of the conductive land 11 is such one that a central portion is a lattice-like placement, an outer peripheral portion being a random placement. The number of the conductive land 11 amounts to approximately 50×40. Such conductive land group is formed within an area of about 150 square mm at the outermost layer of the printed wiring board.

Figure 4B:
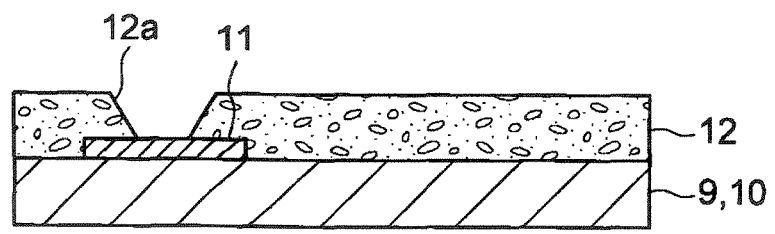

FIG. 4B is a diagram showing a process for forming a solder resist layer. As shown in FIG. 4B, a solder resist layer 12 is coated on the conductive land 11 and the substrates 9,10 by screen printing and an opening portion 12a is formed on the solder resist layer 12. This solder resist layer 12 is formed as follows. An approximately 15 to 25 μm-thick solder resist commercially available on the market under trade name of "SR 7200" manufactured by HITACHI CHEMICAL CO., LTD., for example, is printed on the conductive land 11 by using a screen printing system. Then, a resultant product is dried and exposed by ultraviolet rays of intensity approximately ranging of from 100 to 1000 mj in a state having a 5 mm-thick photo-mask with a land pattern closely contacted therewith and developed by a sodium carbonate solution with a concentration of about 10 g/L. Thereafter, the resultant product is processed by heat treatment and the solder resist layer 12 with the opening portion 12a is formed on the conductive land 11. Alternatively, an insulating film in a semi-cured state may be attached to the conductive land 11 and the substrates 9,10, and the opening portion 11a may be formed on the solder resist layer 12 by using laser light or the like after the attached insulating film was cured.

Figure 4C:
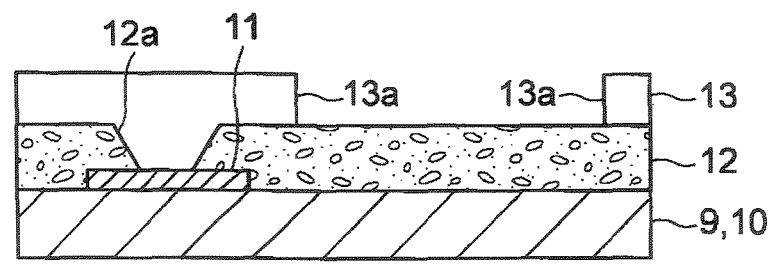

FIG. 4C is a diagram showing a process in which a resist is laminated, exposed and developed. As shown in FIG. 4C, a dry film 13, for example, is laminated on the solder resist layer 12 and an opening portion 13a is formed on the dry film 13 by exposure and development. A circuit forming dry film resist commercially available on the market under trade name of "ALPHO" manufactured by NICHIGO-MORTON CO., LTD., might be used as this dry film 13, it is then attached to the solder resist layer 12 by a vacuum laminator and the opening portion 13a is formed on the dry film 13 by exposure and development. The opening portion 13a is formed on the dry film 13 at the proper position so as not to overlap with the opening portion 12a on the solder resist layer 12 in the thickness direction.

Figure 4D:
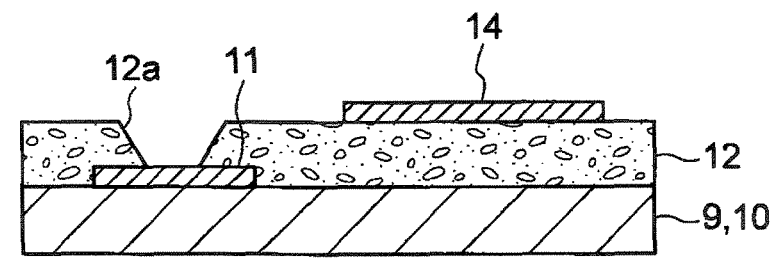

FIG. 4D is a diagram showing a process in which a Sn (tin) layer is formed. As shown in FIG. 4D, a Sn layer 14, for example, is deposited on the whole surface (on the solder resist layer 12 of the bottoms of the dry film 13 and the opening portion 13a) by sputtering. The Sn film 14 should preferably have a film thickness greater than about 0.2 μm. After that, the dry film 13 is stripped from the solder resist layer 12 by using a NaOH aqueous solution with a concentration of about 3 to 5 weight percent. As a result, only the Sn layer 14 is left on the solder resist layer 12 of the bottom of the opening portion 13a. This Sn layer 14 is partly removed by an etching process shown in FIG. 4K and therefore referred to as a "sacrificial layer".

Thereafter, a catalytic nucleus (not shown) for use in electroless plating is given to the resultant product. Noble metal ion and noble metal colloid (e.g. palladium chloride and palladium colloid) may be typically used as an electroless plating catalytic nucleus.

Figure 4E:
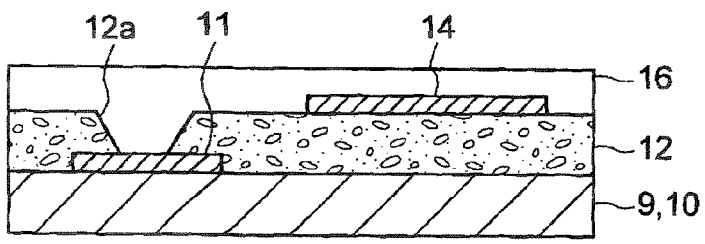

FIG. 4E is a diagram showing a process for forming a first plated layer. A first plating layer 16 may be typically formed by electroless copper plating. Preferably, in order that the deposited first plating layer 16 may become easy to expand with tensile stress, an electroless plating bath may employ tartaric acid as a complexing agent and it may further contain at least one kind of metal ions as an additive to suppress hydrogen from being generated. The first plating layer 16 has a thickness approximately in between 0.5 and 2 μm and a plating solution and plating conditions are as follows.

A plating solution: aqueous solution containing an alkaline compound of about 1.125 to 1.25 mol/l, a reducing agent of about 0.03 to 0.15 mol/l, copper ions of about 0.02 to 0.065 mol/l and tartaric acid of about 0.05 to 0.3 mol/l or its salt.

An additive: metal ions of one kind selected from a group consisting of nickel ions of 0.01 to 0.05 weight percent, iron ions, cobalt ions and the like in the electroless plating solution.

Plating conditions: specific gravity of electroless plating solution falls within a range of from approximately 1.02 to 1.10, a plating solution temperature falls within a range of from about 25 to 40° C. and a plating time falls within a range of from about 0.5 to 4 hours.

Figure 4F:
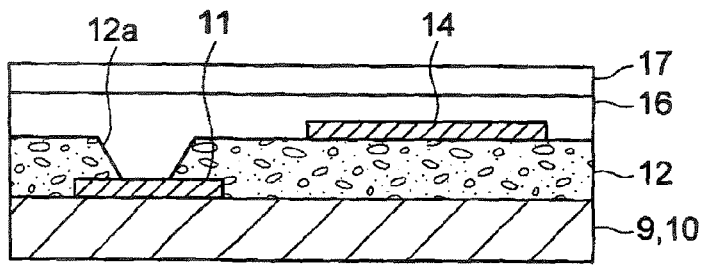

FIG. 4F is a diagram showing a process for forming a second plating layer. A second plating layer 17 may be typically formed by electroless copper plating. Preferably, in order that the deposited second plating layer 17 may become easy to contract with compressive stress, this electroless plating bath may contain EDTA (ethylenediaminetetracetic acid) as a complexing agent and the second plating layer 17 may contain a large quantity of hydrogen. The second plating layer 17 may have a thickness ranging of from about 0.5 to 2 μm and a plating solution and plating conditions are as follows.

Plating solution: about 150 g/L of EDTA, 20 g/L of copper vitriol, about 30 mL/L of HCHO, about 40 g/L of NaOH, about 80 mg/L of α, α'-bipyridyl and about 0.1 g/L of PEG.

Plating conditions: a plating solution temperature is about 70° C. and a plating time falls within a range of from about 0.5 to 4 hours.

As a result, a bilayer structure consisting of the first plating layer 16 which is easy to expand with tensile stress and the second plating layer 17 which is easy to contract with compressive stress are formed on the solder resist layer 12 and the Sn layer 14. This bilayer structure will be formed as the component mounting pin 18 (see FIG. 1) through the subsequent processes.

Figure 4G:
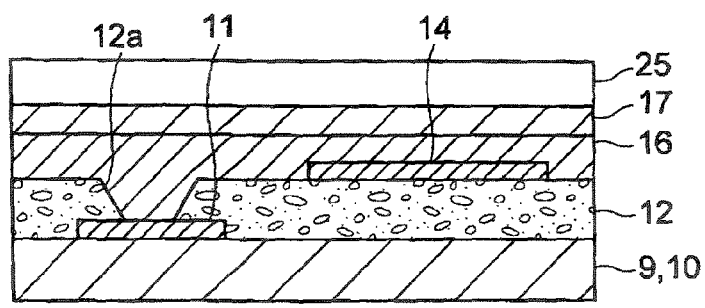

FIG. 4G is a diagram showing a process for laminating an etching resist. For example, a dry film 25 is laminated on the second plating layer 17. A commercially-available dry film is attached to the second plating layer 17 by using a vacuum laminator as this dry film 25.

Figure 4H:
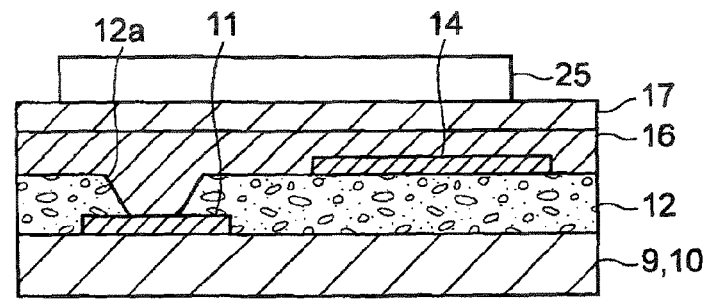

FIG. 4H is a diagram showing a process for exposing and developing the etching resist 25. According to this process shown in FIG. 4H, there is formed the etching resist 25 for use with the next etching process.

Figure 4I:
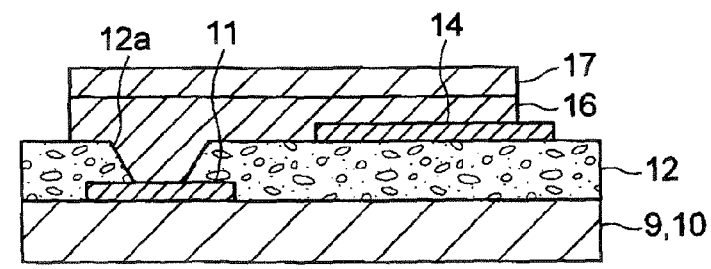

FIG. 4I is a diagram showing an etching process for etching the first and second plating layers 16 and 17. As shown in FIG. 4I, the etching resist 25 is used to etch the first and second plating layers 16 and 17, each of which is the electroless plating layer, to form a conductive land (pattern). When "E-PROCESS", trade name, manufactured by MELTEX INC., is employed, since etching rates of copper (Cu) and tin (Sn) are considerably different from each other, the copper plating layer can be removed selectively. Thereafter, the etching resist 25 is stripped from the second plating layer 17.

Figure 4J:
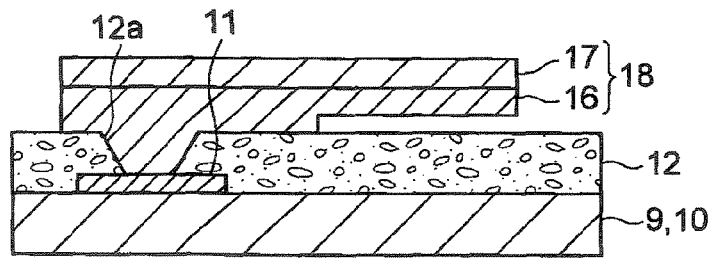

FIG. 4J is a diagram showing an etching process of the Sn layer 14. As shown in FIG. 4J, the Sn layer 14 located under the first plating layer 16 is partly etched away by using a Sn stripping agent. A stripping agent manufactured by MELTEX INC., under trade name of "ENSTRIP" may be used as the Sn stripping agent. This partial etching is carried out by adjusting an etching time, for example.

Figure 4K:
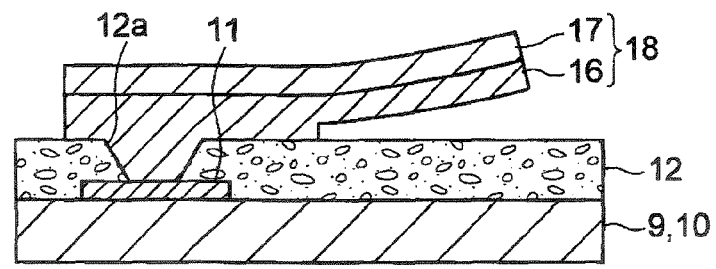

FIG. 4K is a diagram showing a process for forming a component mounting pin. As shown in FIG. 4K, the Sn layer 14 located under the first plating layer 16 is removed and thereby the component mounting pin 18 is formed. Since this component mounting pin 18 is formed by the bilayer structure composed of the first plating layer 16 which is easy to expand with tensile stress and the second plating layer 17 which is easy to contract with compressive stress, the first plating layer 16 expands and the second plating layer 17 contracts to cause this component mounting pin 18 to erect upward.

Figure 4L:
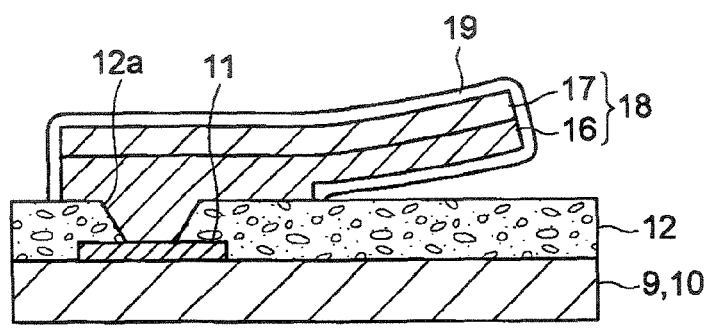

FIG. 4L is a diagram showing a process for forming a protective film. As shown in FIG. 4L, a desired protective film (coating) 19 is formed on the component mounting pin 18 if necessary. Either a coating of a single layer or coatings of a plurality of layers selected from Ni, Au, Cu, Pd/Sn and the like may be formed as this coating by using plating, for example.

MODIFIED EXAMPLE

In the above-described plating method, the component mounting pin 18 is composed of the first plating layer 16 and the second plating layer 17 of the same electroless copper plating. However, the method of forming the component mounting pin 18 is not limited thereto.

(1) The component mounting pin 18 may have a multilayer structure with different mechanical properties. For example, the component mounting pin 18 may have a multilayer structure including a lowermost layer which is easy to expand with tensile stress and an uppermost layer which is easy to contract with compressive stress to enable the component mounting pin 18 to erect upward with ease.

(2) The component mounting pin 18 may be made of more than two kinds of metals with different coefficients of thermal expansion and it may have a multilayer structure including an uppermost metal with a relatively small coefficient of thermal expansion and a lowermost metal with a relatively large coefficient of thermal expansion so that the component mounting pin 18 can be erected easily by using bimetal effect.

In the foregoing (1) and (2), values of the layers located at the intermediate position should fall within a range of from the values (of stress or of coefficient of thermal expansion) of the lowermost layer to the values (of stress or of coefficient of thermal expansion) of the uppermost layer, and the values of the intermediate layer might be changed progressively from the lowermost layer to the uppermost layer.

[Method Using Sputtering]

A typical example of a method of manufacturing a printed wiring board with a component mounting pin will be described with reference to FIGS. 5A to 5M in conjunction with a method using sputtering (sputtering method).

Also in the sputtering method, it is to be appreciated that elements and parts other than the outermost conductor are omitted from the description of the following manufacturing method similarly to the plating method that has been described so far with reference to FIGS. 4A to 4M.

Figure 5A:
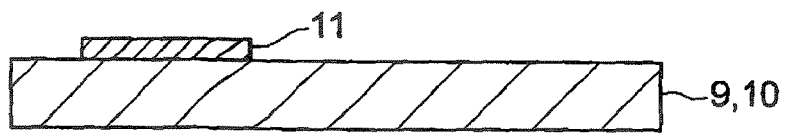
FIGS. 5A to 5K are diagrams showing respective processes of a method of manufacturing a printed wiring board with a component mounting pin by sputtering.

FIG. 5A is a diagram showing a process for preparing a substrate (other portion than the outermost conductor). This process is substantially identical to that of FIG. 4A of the plating method.

Figure 5B:
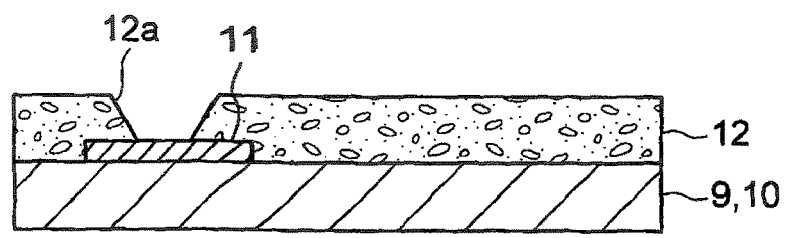

FIG. 5B is a diagram showing a process for forming the solder resist layer 12 and the opening 12a. This process is substantially identical to that of FIG. 5B of the plating method.

Figure 5C:
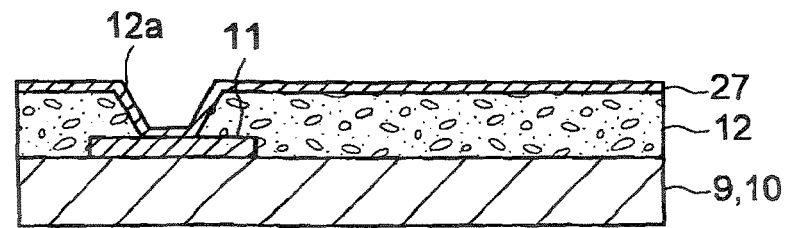

FIG. 5C is a diagram showing a process for depositing a titanium (Ti) film 27 on the whole surface (upper surfaces of the solder resist layer 12 and the opening 12a) by sputtering. The Ti film 27 is partly removed by the subsequent process (see FIG. 5H) and therefore referred to as a "sacrificial layer".

Figure 5D:
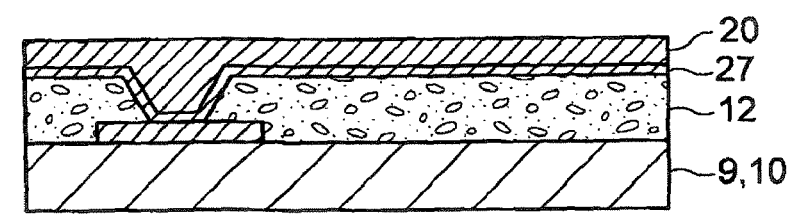

FIG. 5D is a diagram showing a process for depositing a molybdenum/chromium (Mo/Cr) film 20 on the upper surface of the Ti film 27 by sputtering. This Mo/Cr film 20 has a 1 μm thickness of about 1 μm. While the first and second plating layers 16 and 17 are formed by using electroless plating in FIGS. 4F and 4E of the above-described plating method, the Mo/Cr film 20 is deposited by sputtering in this process shown in FIG. 5D.

Figure 5E:
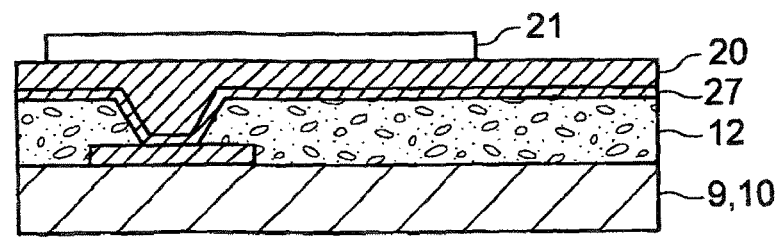

FIG. 5E is a diagram showing a process for laminating, exposing and developing the etching resist 21. The etching resist 21 might be a resist having resistance against an etchant of the Mo/Cr film 20.

Figure 5F:
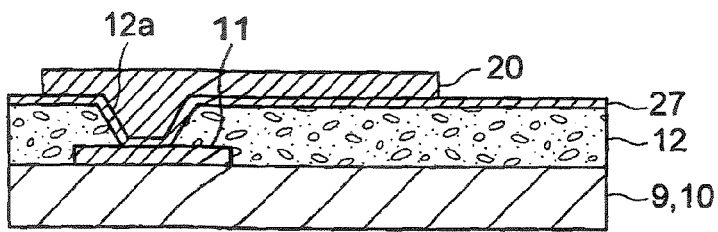

FIG. 5F is a diagram showing an etching process of the Mo/Cr film 20. The conductive land (pattern) is formed by using the etching resist 21 to etch the Mo/Cr film 20. Thereafter, the etching resist 21 is stripped from the Mo/Cr film 20.

Figure 5G:
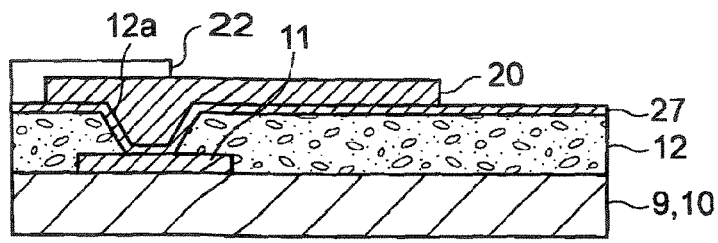

FIG. 5G is a diagram showing a process for laminating, exposing and developing the etching resist 22. The etching resist 22 might be a resist having resistance against an etchant of the El layer 27 and it might be a resist to protect the Ti layer 27 from being etched away in the next process.

Figure 5H:
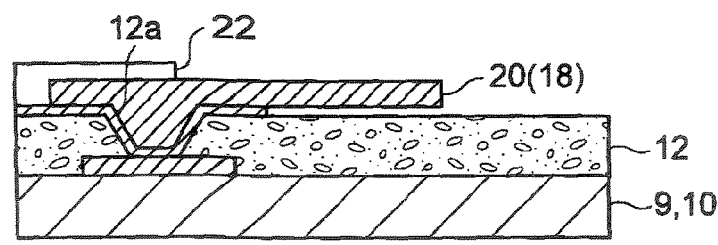

FIG. 5H is a diagram showing an etching process of the Ti layer 27. A conductive land (pattern) is formed by using the etching resist 22 to partly etch the Ti layer 27. The Ti layer 27 is partly etched by adjusting an etching time, for example. After that, the etching resist 22 is stripped from the Mo/Cr film 20. The Mo/Cr film 20 is a portion which finally becomes the component mounting pin 18.

Figure 5I:
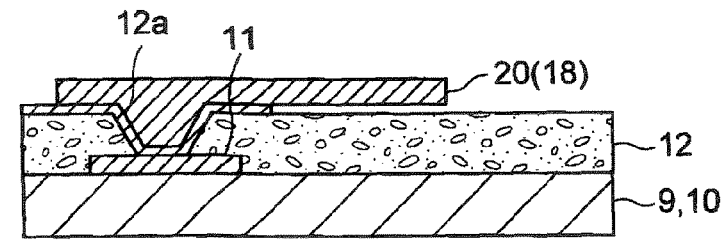

FIG. 5I is a diagram showing a stripping process of the etching resist 22.

Figure 5J:
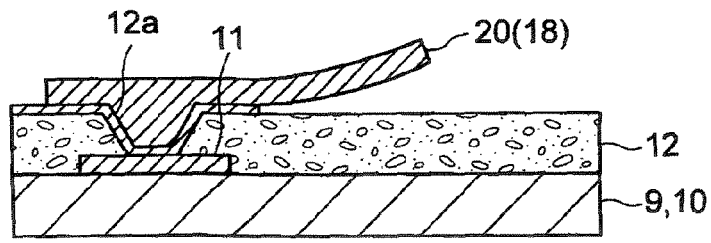

FIG. 5J is a diagram showing an annealing process. By the annealing process, the Mo/Cr film 20 is erected upward at its portion which will become the component mounting pin 18. The annealing is carried out at about 100 to 230° C.

Figure 5K:
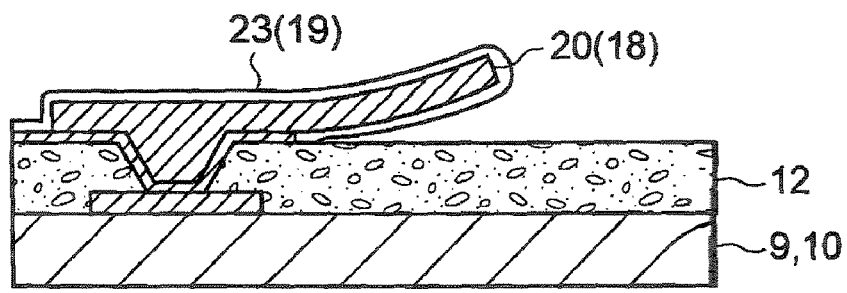

FIG. 5K is a diagram showing a protective film treatment process for the component mounting pin 18. As this protective film (coating) 23, there is formed a film such as Ni, Au, Cu or Pd/Sn by using plating, for example. The protective film 23 might be identical to the coating 19 in the process shown in FIG. 4L.

MODIFIED EXAMPLE (1) The component mounting pin 18 may be formed of a plurality of layers with different mechanical properties. For example, when the component mounting pin 18 is formed of two layers, the component mounting pin 18 is formed to have a bilayer structure consisting of a lower layer which is easy to expand with tensile stress and an upper layer which is easy to contract with compressive stress by changing sputtering conditions (e.g. gas pressure, kind of mixed gas, partial pressure of mixed gas, sputtering power, etc.) of the upper and lower layers. In this manner, the component mounting pin 18 can be erected with ease. When the component mounting pin 18 is formed of a plurality of layers, stress of the uppermost layer may be under compressive stress relative to stress of the lowermost layer and stress of the intermediate layer should preferably be prevented from becoming under tensile strength relative to stress of the layer below it.

(2) The component mounting pin 18 may be formed of a plurality of layers with different coefficients of thermal expansion.

When the component mounting pin 18 is formed of two layers (bilayer), a metal with a relatively low coefficient of thermal expansion is selected to form the upper layer and a metal with a relatively high coefficient of thermal expansion is selected to form the lower layer. When the component mounting pin 18 is formed of a plurality of layers, the uppermost layer may have a lower coefficient of thermal expansion than that of thermal expansion of the lowermost layer and the intermediate layer should preferably have an equal or lower coefficient of thermal expansion to or than that of thermal expansion of the layer below it. If the component mounting pin formed of a plurality of layers is manufactured as a substantially flat component mounting pin at a temperature in which it is in use or at a temperature in which the component mounting pin is fixed, contact between the component mounting pin and the electronic component can be maintained.

(3) When the component mounting pin 18 is made of more than three kinds of metals, metals of the layers below the metal of the upper layer may be selected from substances having larger coefficients of thermal expansion than hose of thermal expansion of the metals of the upper layers.

[The Others]

While the embodiments of a method of manufacturing a printed wiring board with a component mounting pin have been described so far, these embodiments are described by way of example and the present invention is not limited thereto and addition, deletion, alteration, improvement and the like that can be made by those skilled in the art may be included in the scope of the present invention.

For example, while the portions in which the sacrificial layers are formed are different in the above-mentioned method using plating and the method using sputtering, the plating portion in the manufacturing process using plating may be changed to the sputtering portion or the sputtering portion in the manufacturing process using sputtering may be changed to the plating portion.

The technical scope of the present invention is determined by the description of the appended claims.

What is claimed is:

1. A printed wiring board manufacturing method, comprising:
    forming a multilayer printed wiring board having a conductive layer, an outermost conductive layer formed in an outer portion of the multilayer printed wiring board with respect to the conductive layer and electrically connected to the conductive layer, and a solder resist layer formed over the outermost conductive layer and having an opening exposing a portion of the outermost conductive layer;
    forming a sacrificial layer on a portion of a surface of the solder resist layer;

forming a plurality of plating layers on the portion of said outermost conductive layer, said sacrificial layer and the solder resist layer such that the plurality of plating layers includes a first plating layer formed on the portion of the outermost conductive layer, the sacrificial layer and the solder resist layer and a second plating layer formed over the first plating layer and such that the first plating layer has a coefficient of thermal expansion which is higher than a coefficient of thermal expansion of the second plating layer;

patterning the plurality of plating layers so as to shape a component mounting pin comprising a patterned portion of the plating layers;

removing said sacrificial layer under the patterned portion of said plurality of plating layers; and erecting said component mounting pin such that the component mounting pin protrudes from the opening of the solder resist layer.

2. A printed wiring board manufacturing method according to claim 1, wherein said first plating layer is formed by electroless copper plating using an electroless plating bath having at least one metal ion which suppresses hydrogen from being generated.

3. A printed wiring board manufacturing method according to claim 2, wherein said metal ion is at least one selected from the group consisting of nickel ion, iron ion and cobalt ion.

4. A printed wiring board manufacturing method according to claim 1, wherein said second plating layer is formed by electroless copper plating using an electroless plating bath including EDTA which causes said second plating layer to contain a large quantity of hydrogen.

5. A printed wiring board manufacturing method according to claim 1, wherein said sacrificial layer is formed of a Sn layer deposited by sputtering.

6. A printed wiring board manufacturing method according to claim 1, wherein said removing of said sacrificial layer comprises etching said sacrificial layer.

7. A printed wiring board manufacturing method according to claim 1, wherein the erecting of the component mounting pin comprises annealing the component mounting pin.

8. A printed wiring board manufacturing method according to claim 1, wherein said plurality of plating layers comprises a Mo/Cr film.

9. A printed wiring board manufacturing method according to claim 1, wherein said second plating layer comprises a metal with a relatively low coefficient of thermal expansion, and the first plating layer comprises a metal with a relatively high coefficient of thermal expansion.

10. A printed wiring board manufacturing method according to claim 1, wherein said sacrificial layer is formed of a Ti layer deposited by sputtering.

11. A printed wiring board manufacturing method according to claim 6, wherein said etching of said sacrificial layer comprises adjusting an etching time.

12. A printed wiring board manufacturing method according to claim 1, wherein the forming of the sacrificial layer comprises forming the sacrificial layer on an entire surface of the surface of said solder resist layer.

* * * * *